United States Patent [19]

Bauer

[11] Patent Number: 5,787,007
[45] Date of Patent: Jul. 28, 1998

[54] STRUCTURE AND METHOD FOR LOADING RAM DATA WITHIN A PROGRAMMABLE LOGIC DEVICE

[75] Inventor: Trevor J. Bauer, Campbell, Calif.

[73] Assignee: Xilinx, Inc., San Jose, Calif.

[21] Appl. No.: 593,985

[22] Filed: Jan. 30, 1996

[51] Int. Cl.[6] .................. H03K 19/177; H03K 17/693
[52] U.S. Cl. .................. 364/489; 364/488; 326/41; 326/39
[58] Field of Search ................ 395/500; 364/488, 364/489, 490; 326/38–41; 365/230.08; 340/825.83

[56] References Cited

U.S. PATENT DOCUMENTS

| Re. 34,363 | 8/1993 | Freman | 307/465 |
|---|---|---|---|
| 4,870,302 | 9/1989 | Freeman | 326/41 |
| 5,150,048 | 9/1992 | McAuliffe et al. | 371/22.1 |
| 5,243,273 | 9/1993 | McAuliffe et al. | 371/22.1 |
| 5,361,373 | 11/1994 | Gilson | 395/800.01 |
| 5,430,687 | 7/1995 | Hung et al. | 365/230.08 |
| 5,572,148 | 11/1996 | Lytle et al. | 326/41 |
| 5,623,217 | 4/1997 | Britton et al. | 326/40 |
| 5,640,107 | 6/1997 | Kruse | 326/38 |
| 5,646,545 | 7/1997 | Trimberger et al. | 326/38 |

OTHER PUBLICATIONS

"The Programmable Logic Data Book", pp. 2–7 to 2–46, copyright 1994, Xilinx, Inc., 2100 Logic Drive, San Jose, CA 95124.

*Primary Examiner*—Vincent N. Trans
*Attorney, Agent, or Firm*—Adam H. Tachner; Crosby, Heafey, Roach & May; Jeanette S. Harms

[57] ABSTRACT

A method and apparatus for loading memory within a reconfigurable programmable logic device including configuring the device as a RAM loader circuit, loading the RAM with data and then reconfiguring the device with a circuit utilizing the loaded RAM. The inventive method and apparatus allow use of the RAM as high density functional centers of the desired design immediately upon initialization of the circuit, without wasting valuable time or FPGA resources on a static, non-flexible RAM loader structure.

15 Claims, 4 Drawing Sheets

STRUCTURE AND METHOD FOR LOADING RAM DATA WITHIN A PROGRAMMABLE LOGIC DEVICE

BACKGROUND OF THE INVENTION

1. Field of the Invention

The present invention relates to programmable devices, and more particularly to programmable devices having dedicated, on-board random access memory (RAM) and a method for loading data into the RAM.

2. Description of the Related Art

Digital logic can be implemented using several options: discrete logic devices, often called small-scale integrated (SSI) circuits, programmable devices such as programmable logic arrays (PLAs), masked-programmed gate arrays or cell-based application specific integrated circuits (ASICs), and field programmable gate arrays (FPGAs).

FPGAs are general purpose programmable devices that are customized by the end users. FPGAs are composed of an array of configurable logic blocks that are programmably interconnected, usually at power-up. The basic device architecture of an FPGA consists of an array of configurable logic blocks (CLBs) embedded in a configurable interconnect structure and surrounded by configurable I/O blocks (IOBs). An IOB allows signals to be driven off-chip or optionally brought on to the FPGA interconnect segments. The IOB can typically perform other functions, such as tri-stating output signals and registering incoming or outgoing signals. The configurable interconnect structure allows users to implement multi-level logic designs, wherein the output signal of one logic unit is provided as an input signal to another logic unit and the output signal of that logic unit is provided as an input signal to another logic unit, and so on.

Each configurable logic block in an FPGA typically includes configuration memory cells for controlling the function performed by that logic block. These configuration memory cells can implement lookup tables and control multiplexers and other logic elements within a CLB, such as XOR gates and AND gates. Lookup tables implement the combinational logic function corresponding to the truth table stored in the configuration memory cell.

An FPGA can support tens of thousands of gates of logic operating at system speeds of tens of megahertz. The FPGA is programmed by loading programming data into the memory cells controlling the configurable logic blocks, I/O blocks, and interconnect structure. Further information about FPGAs and programming protocol appears at pages 2–7 to 2–46 of the "The Programmable Logic Data Book," incorporated herein by reference, Copyright 1994 by Xilinx, Inc., the assignee of this invention, and available from Xilinx, Inc. at 2100 Logic Drive, San Jose, Calif. 95124.

Configuring an FPGA includes loading a bitstream containing the desired design program data for the CLBs, IOBs, and the configurable interconnect into a plurality of configuration memory cells on the FPGA. The bitstream is typically loaded into the FPGA serially to minimize the number of pins required for configuration and to reduce the complexity of the interface to external memory, although serial data can be converted to parallel form for increased speed. The configuration data, once loaded into the configuration memory cells, dictates the functions performed by the CLBs, IOBs, and configurable interconnect within the FPGA.

Recently, there has been a dramatic increase in the complexity and size of logic circuits used in a variety of applications.

Since the number of CLBs that can be fabricated on a single integrated circuit chip is limited, the increasing number of elements in desired logic circuits often cannot be implemented within a single FPGA. Thus, there is a need to improve the efficiency and functionality of FPGAs and FPGA-implemented logic functions. This efficiency and functionality improvement can be achieved by increasing the amount of memory available on a part through configuration of lookup tables as Random Access Memory (RAM) blocks, thereby increasing the capacity of the part (FPGA capacity is often measured in terms of equivalent logic gates and RAM capacity). But this approach has the disadvantage that lookup tables configured as RAM consume a fairly large amount of silicon chip area.

One prior art approach to solve this shortcoming of existing FPGAs has been to connect multiple FPGAs externally. However, because of the limited number of IOBs available to connect FPGAs, not all circuits can be implemented by this approach. Moreover, using more than one FPGA increases the power consumption, cost, and space required to implement a circuit. Therefore, the multi-device approach provides only a partial solution.

Another method used in the industry to address this challenge is increasing the quantity of logic and interconnect resources within FPGAs. However, for any given fabrication technology, there will be limitations to the number of CLBs that can be fabricated with the necessary interconnect on a single FPGA part. Thus, there continues to be a need, from an architectural standpoint, to increase the functional capacity of FPGAs.

One solution currently under development in the industry is the incorporation of course-grained block RAM into the FPGA architecture. Coarse-grained RAM may be broadly defined as a memory block having the capacity to store more than several lookup tables' worth of memory elements, or bits, contrasted with fine-grained RAM, such as memory-configured lookup tables, which can be configured as very small blocks as fine as 16×1 bits and smaller. Coarse-grained block RAM can also be distinguished from lookup tables configured as memory by higher densities and faster access times. Also, coarse-grained block RAM provides a more predictable delay than smaller lookup table-based memory blocks because lookup table-based memory blocks are dependent upon configured decoders for functionally linking smaller elements into blocks. Such configured decoders add an element of uncertainty to circuit timing and create significant delays which varies with the size of the linked block. In contrast, coarse-grained RAM blocks have built-in decoders with predictable timing characteristics.

Moreover, routing challenges created by the use of configurable memory cells are eliminated by the use of course-grained block RAM. The large capacity per area of coarse-grained block RAM enables designers to implement complex functions in one logic level without the routing delays associated with linked CLBs in multi-level functions. For example, a single block RAM could accommodate a large multiplier, control logic for a state machine, coefficients for a digital signal filer, or any other desired structure compatible with the available RAM configurations. Also, logic functions can be implemented in coarse-grained RAM by programming the RAM with a read-only pattern, creating a large Read Only Memory (ROM). Coarse-grained RAM and other types of quickly accessible memory in block form are thus highly compatible with FPGA architectures and significantly increase FPGA functionality.

While adding memory block types other than lookup tables configured as memory can help increase device density, problems remain. A common default initialized state for available block RAM within programmable devices is an "all zero" state. However, using block RAM as anything other than read/write memory, such as circuitry for implementing complex logic functions or on-board ROM, requires a non-zero state immediately after device configuration. Thus, it is desirable for block RAM on an FPGA to default to an all-zero state, but be capable of starting at a non-zero initialization state as well. This challenge is addressed by the present invention.

SUMMARY OF THE INVENTION

The present invention provides a method (and apparatus) for loading data into a random access memory (RAM) block within a programmable logic device and comprises the steps of configuring the programmable logic device as a first circuit capable of loading the data into the RAM block, loading the data into the RAM block, and configuring the programmable logic device as a second circuit which utilizes the data loaded into the RAM block. Preferably, the configuration information for the first circuit, the data, and configuration information for the second circuit are combined to form a single data stream which is input to the programmable logic device.

In the preferred embodiment, the memory block is comprised of a plurality of memory elements, the programmable logic device is a field programmable gate array (FPGA) or a partially reconfigurable field programmable gate array (FPGA). Input lines to the programmable logic device function as input lines for loading the data through the first circuit.

In the preferred embodiment, the data is received in a register means in the first circuit and forwarded to the RAM block. The data is written to a predetermined position within the RAM block using an addressing means. Both the register means and the addressing means are controlled.

BRIEF DESCRIPTION OF THE DRAWINGS

The aforementioned advantages of the present invention as well as additional advantages thereof will be more clearly understood hereinafter as a result of a detailed description of a preferred embodiment of the invention when taken in conjunction with the following drawings in which.

DETAILED DESCRIPTION OF THE DRAWINGS

Figure 1:
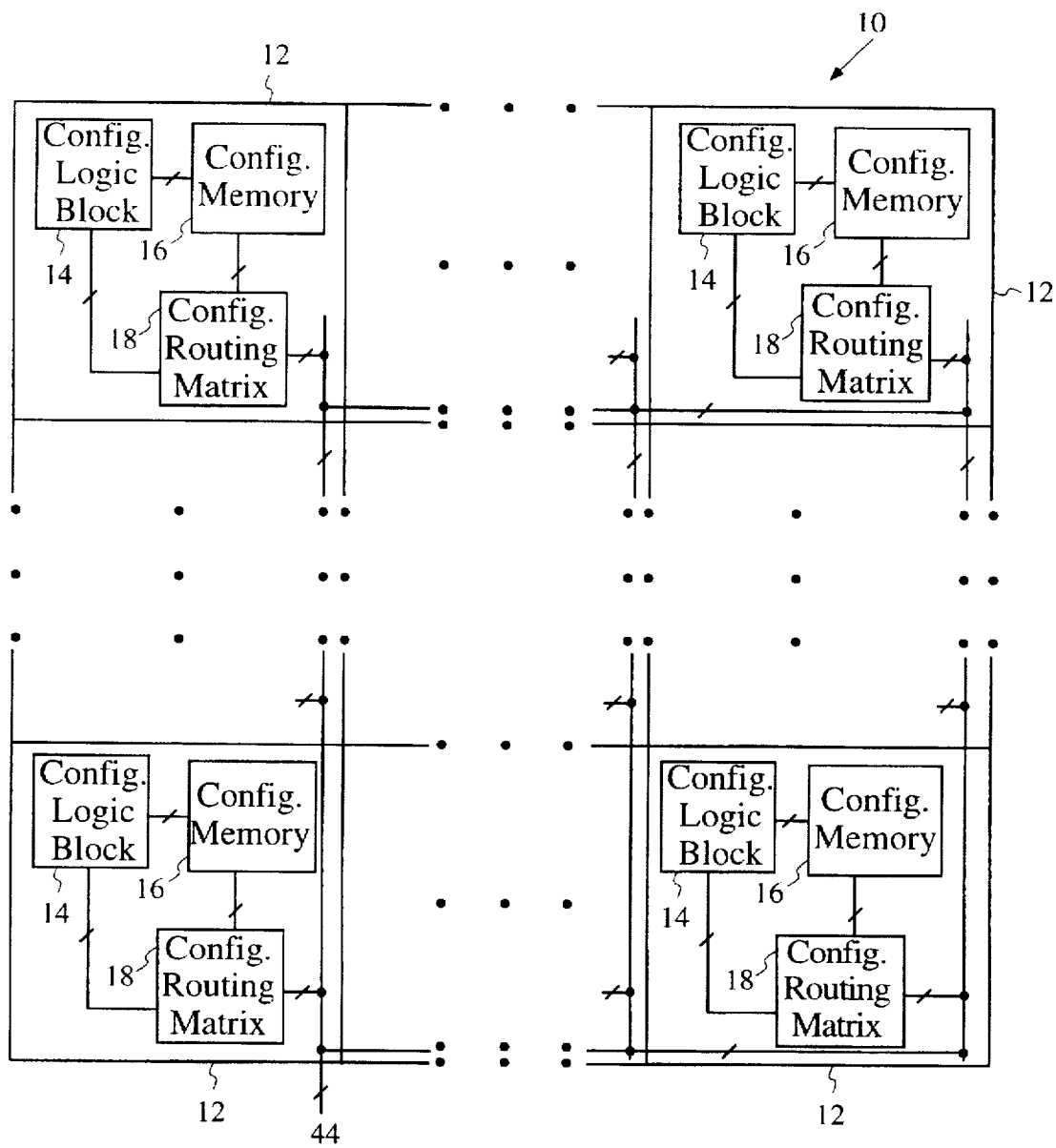
FIG. 1 is a block diagram showing one embodiment of an FPGA with which the present invention may be used.

FIG. 1 illustrates an FPGA 10 comprising a plurality of tiles 12, each tile 12 including a configurable logic block (CLB) 14, a configuration memory 16, and a configurable routing matrix 18. The routing matrices 18 connect to each other and thus interconnect the CLBS. The routing matrices also connect to external pins via lines 44.

Each tile 12 implements a portion of a user's circuit. The 10 logic function of each tile 12 is carried out by its respective CLB 14. Each CLB 14, and thus each tile 12, is capable of performing a plurality of different logic functions. The logic function performed by a CLB 14 is determined by the data stored in the configuration memory 16 corresponding to CLB 14. CLB 14 includes input terminals for receiving logic function data and configuration data, as well as output terminals for forwarding logic function data.

Configurable routing matrix 18 includes configuration input terminals for receiving configuration data and, in response to receipt of the configuration data, controlling the coupling of the CLB data input and output terminals. According to the data stored in configuration memory 16, configurable routing matrix 18 selectively connects the external pins of the FPGA 10 to various CLBs 14, and selectively interconnects predetermined CLBs 14.

Configuration data for each CLB 14 and each configurable routing matrix 18 of a tile 12 are stored in the corresponding configuration memory 16. The configuration data are loaded into the configuration memory 16 from outside the FPGA 10, and may be loaded through a shift register having at least one external pin. Such a loading means is discussed by Freeman in U.S. Pat. No. Re 34,363, incorporated herein by reference. The output terminals of each configuration memory 16 are coupled to their respective CLB 14 and configurable routing matrix 18.

Figure 2:
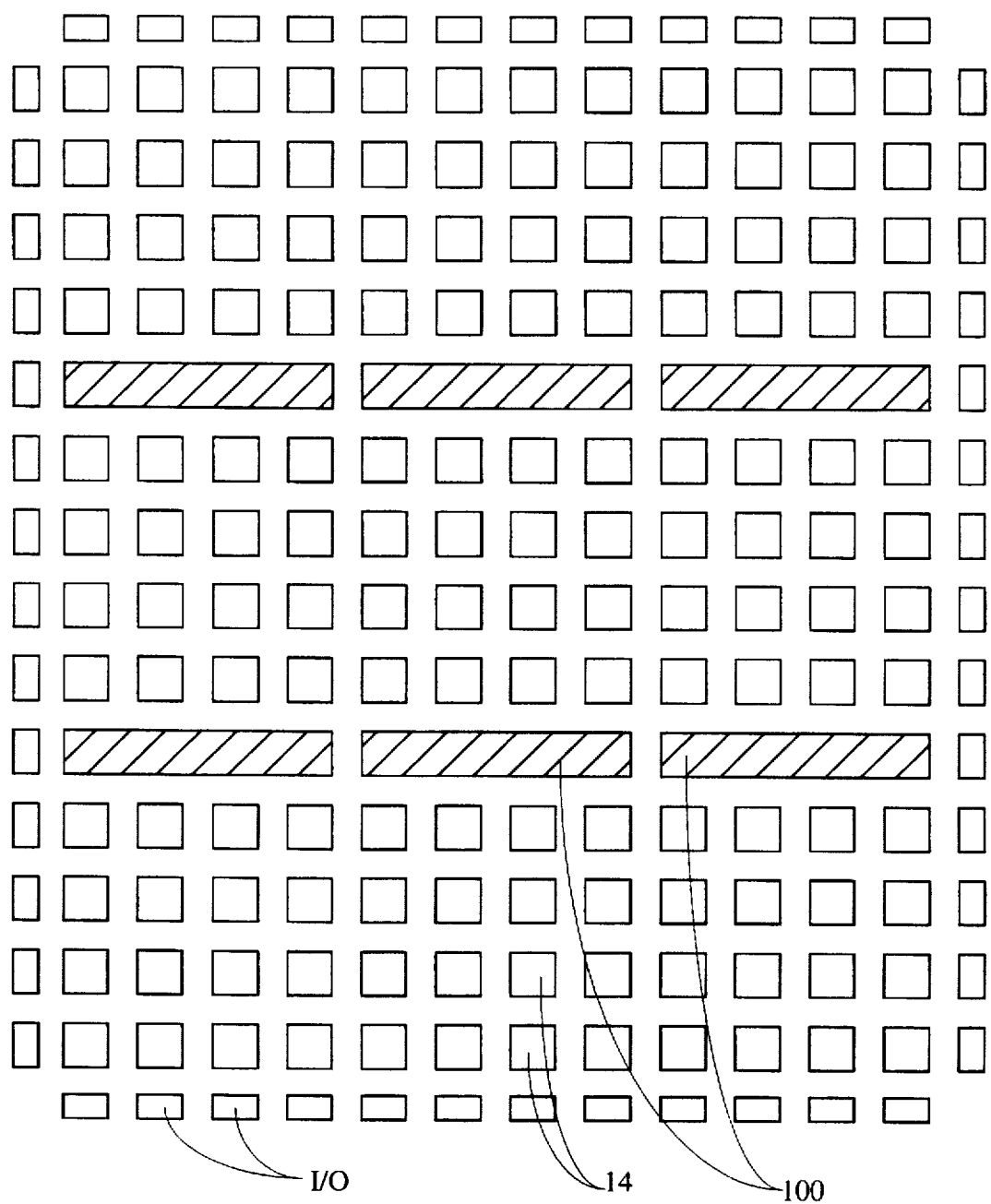
FIG. 2 is a block diagram showing an FPGA having coarse-grained, on-board RAM, said FPGA being compatible with the method of the present invention.
Figure 3:
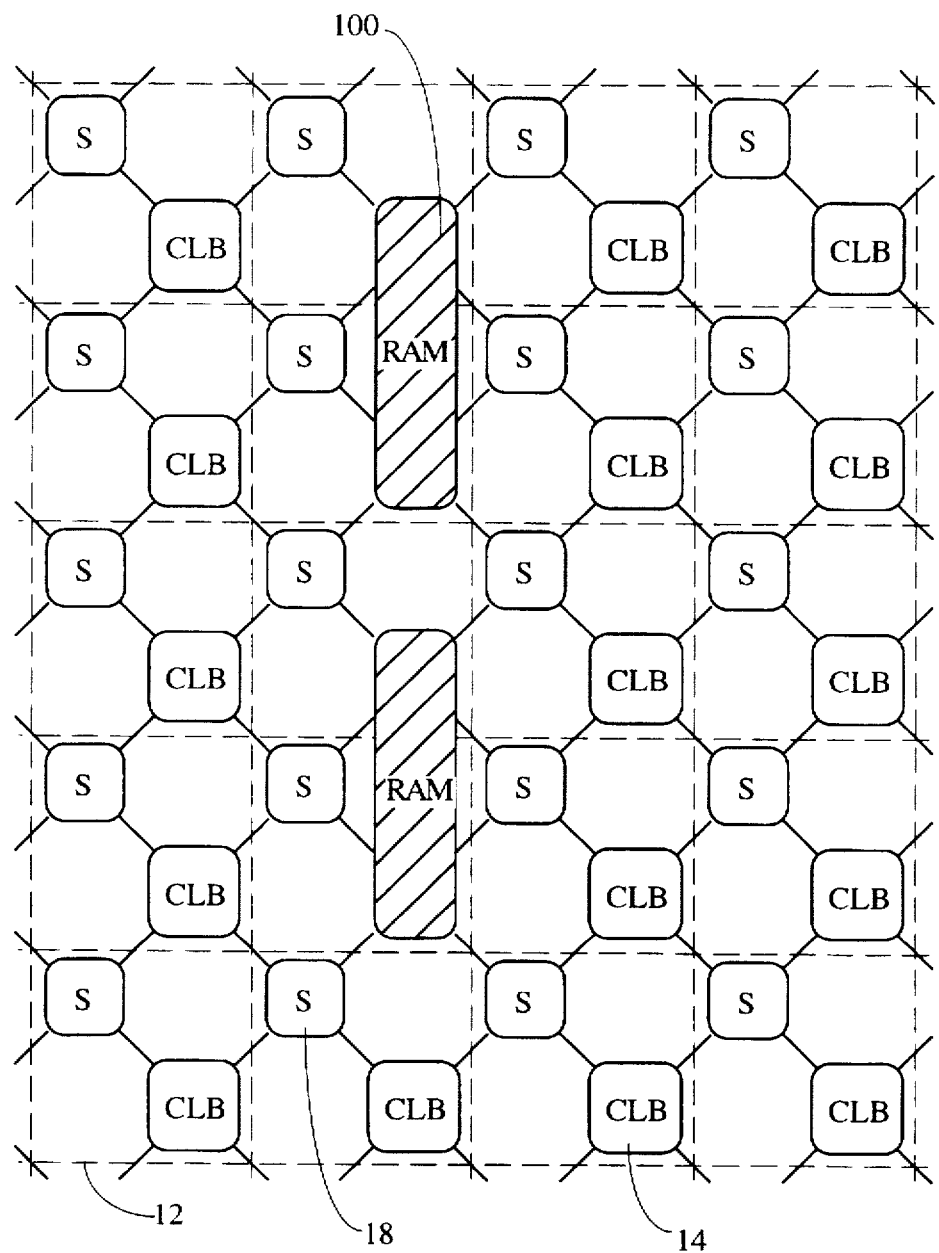
FIG. 3 illustrates a closer view of the FPGA of FIG. 2.

FIG. 2 illustrates an FPGA having coarse-grained RAM blocks 100 located at points within the logic array for easy access and interconnection with selected CLBs 14. Also, each RAM block 100 has access to local interconnect for interconnection with other RAM blocks in the associated vertical column to form enlarged RAM arrays. FIG. 3 provides a closer view of the FPGA having coarse-grained RAM blocks 100.

While the inclusion of RAM in an FPGA or other PLD in the manner shown in FIGS. 2 & 3 is useful, a significant portion of valuable chip area must be dedicated to a structure for routing data to the RAM. This dedicated loading structure represents wasted space in user's designs requiring an initial all-zero state for the on-chip RAM, since coarse-grained block RAM could, for these designs, be set to automatically achieve such an all-zero state without a dedicated loading structure.

The present invention eliminates the need to hardwire a structure for loading on-chip RAM. Specifically, the present invention exploits the availability of a configurable environment in an FPGA wherein, given the proper bitstream for design configuration, the FPGA itself can function as a RAM loader, thereby conserving valuable on-chip resources while allowing for a non-zero initialized on-chip RAM state.

Also, because on-board RAM can be selectively interconnected to represent different functional block shapes (e.g., 256×8-bit, 512×4-bit, 1,024×2-bit, 2,048×1-bit), the inventive RAM loader design configuration can be optimized for a RAM layout optimized for data loading, while the user's subsequently loaded FPGA design can include an entirely different RAM configuration optimized for the user's design.

The present invention therefore includes a method and system for loading data into FPGA on-board memory structures (e.g., course-grain blocks of internal, dedicated RAM) to enable utilization of such structures immediately upon boot up, without waiting for post-programming initialization, and in a manner which exploits the flexibility of FPGA structure. In a broad sense, the method of the present invention includes three steps: configuring a programmable device as a RAM loader circuit, loading the on-board RAM, and reconfiguring the device as desired.

Figure 4:
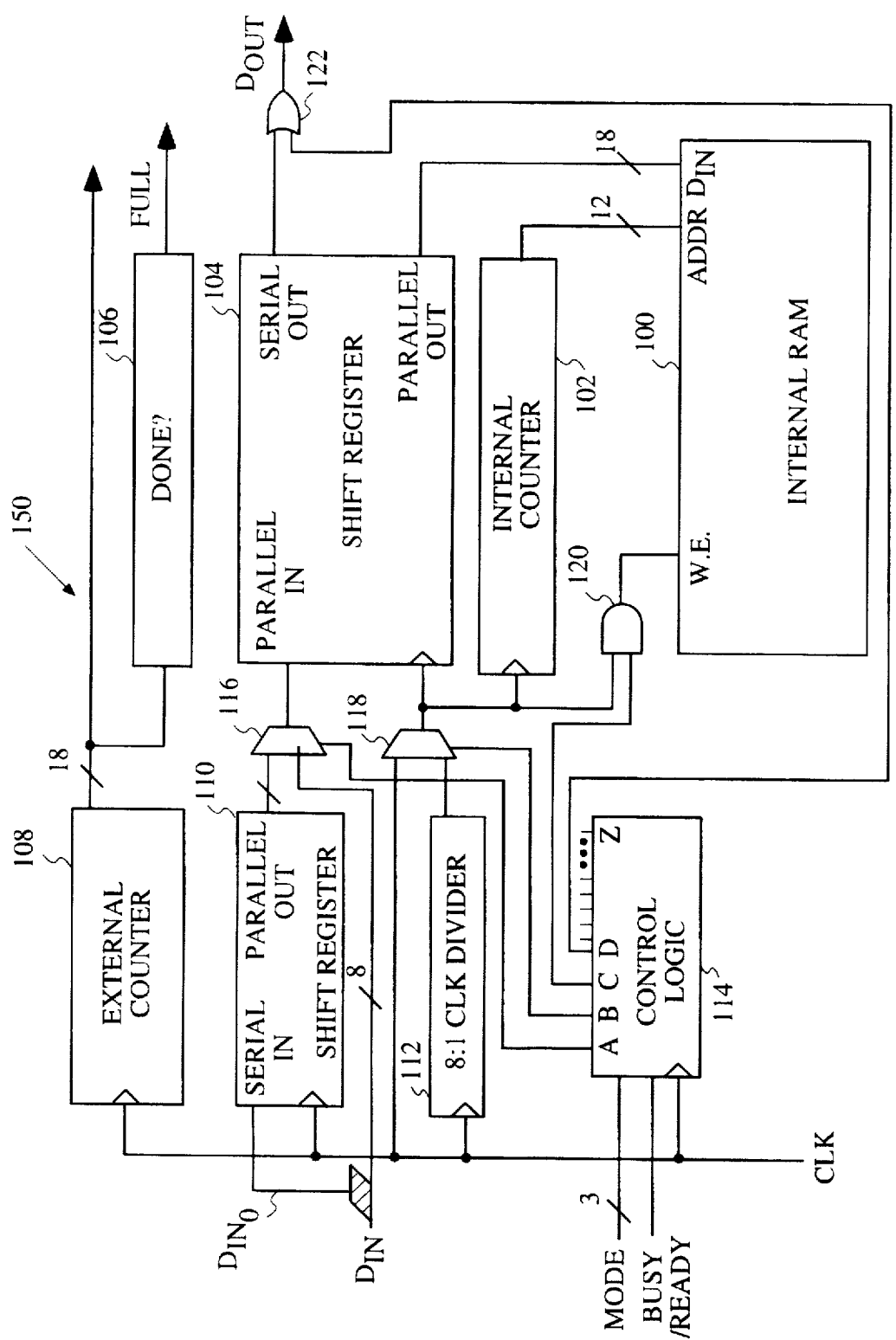
FIG. 4 is a block diagram of a circuit design for loading RAM within an FPGA.

A preferred embodiment of the RAM loading circuit design of the present invention is illustrated in FIG. 4. RAM loader circuit design 150 is compatible with any programmable logic device configuration loading mode desired by the user. For example, a 10 device could load the RAM loader circuit design under its own clock (master mode), as a peripheral device, as a slave to another device, or within a chain of serially loading devices (a daisy chain). Each of these loading modes is described in The Programmable Logic Data Book at pages 2–7 to 2–46, cited above. The loading mode desired by the user is set via a 3-bit signal sent to the mode input terminal of control logic block 114 in FIG. 4.

The circuit design of FIG. 4 includes a number of bus-width references for various input lines, output lines and connections between blocks. These references are provided only for example and are not intended to limit the scope of the present invention to any particular bus-width or FPGA part constraint. The numbers shown in RAM loader circuit design 150 correspond to an FPGA part with $2^{16}$ bits of design data and $2^{12}$ bytes ($2^{15}$ bits) of course-grained RAM space.

Also, for the design of FIG. 4, it is assumed that the course-grained RAM on the programmed FPGA part can be configured to simulate a single block (represented by block 101) with a continuous address space of, for example, $2^{12}$ 8-bit elements, even though a number of RAM blocks are actually distributed throughout the FPGA. Once the block is loaded with the desired data for circuit initiation, the RAM block can then be reconfigured for any layout desired, (e.g., a 512 element first-in, first-out memory stack (FIFO), or two 2k×8-bit ROM). For a device wherein the RAM size or layout is different, design 150 may be altered accordingly in a manner known to those skilled in the art to which the present invention pertains.

Control Logic Block 114 tracks the desired configuration mode and, if necessary, ensures compliance with any required handshaking protocol. Control logic output signals A through Z are fed to a number of other blocks in design 150 to set constant values, enable clocks, reset values and select inputs to multiplexers. Labeled signals A through D exemplify the function and connectivity of all other control logic signals E through Z, not shown.

When configuring in master mode with serial data input, external counter 108 resets to $2^{16}$, i.e. the address of the bit following the end of the program data used to create loader design 150. Done? block 106 includes a comparator which signals via output 107 that RAM block 100 is full once External Counter 108 reaches $2^{16}+2^{15}$ ($3\times2^{15}$) (the total number of bits in the bitstream loaded up to that point including loader design configuration data plus dedicated RAM data). Multiplexer 116 routes data from shift register 110 to shift register 104 when the design is loading data in serial mode.

In parallel mode, control logic block 114 signals multiplexer 116 to forward 8-bit data from $D_{IN}$ directly to shift register 104 (i.e. bypassing shift register 110). Shift register 110 functions to parallelize the serial data input $D_{INO}$ into a byte-wide form for feeding into RAM block 100, configured for byte-wide data loading. Internal counter 102 and the RAM block write enable terminal W.E. are clocked from clock divider 112 (in this embodiment, an 8 to 1 divider) to allow sufficient time for shift register 110 to buffer a full byte before the RAM block address tracked by internal counter 102 is incremented. Shift register 104 can be clocked from either the standard clock signal CLK or 8 to 1 clock divider 112, depending upon the configuration mode selected.

In master parallel mode, wherein the FPGA drives its own clock and outputs address destinations to the data source, external counter 108 resets to $2^{13}$ to address the bit following the program data to be loaded from external ROM or flash memory. Done? block 106 signals that the RAM is full once the external counter hits $2^{13}+2^{12}$ (the total number of parallel-loaded bytes including loader circuit 150 configuration data (for example) and RAM data to be loaded). Multiplexer 116 routes data directly from $D_{IN}$. Internal counter 102 and RAM block write enable terminal W.E. are clocked directly from signal CLK via multiplexer 118. In another embodiment, external counter could be set to decrement rather than increment and Done? block 106 is set to trigger when external counter 108 reaches $2^{18}-2^{16}-2^{15}-1$, rather than $2^{16}+2^{15}$.

In slave serial configuration mode, external counter 108 functions only to count the number of bits read. Signal FULL from Done? block 106 is no longer required off-chip. As in other configuration modes, internal counter 102 steps through the on-chip RAM addresses. Shift registers 104 and 110 serve to parallelize the input data.

In peripheral mode, wherein the FPGA shares data bus access with other devices, control logic block 114 responds to the Busy/Ready input signal. Specifically, the Busy signal can be used as a handshake signal to start and stop the loading of RAM block 100 in response to use of the data bus by other devices.

RAM loader circuit design 150 also functions with daisy chained FPGAs parts in any compatible configuration mode. Moreover, when FPGAs are daisy chained, RAM loader circuit design 150 can be configured in all of the FPGAs simultaneously, since the design would be identical for every identical FPGA in the chain. In the circuit of FIG. 4, gate 122 functions as an output enable for daisy chained devices. Gate 120 functions to disable RAM block 100 in daisy chain mode when data destined for devices further down the chain pass through circuit 150.

Another advantage of RAM loader circuit design 150 is the use of the same address I/O pins for sending data to RAM block 101 as those used for configuring the circuit, thereby allowing the use of a continuous bitstream including the loader configuration and RAM data, as well as the ultimately desired FPGA design configuration bit stream. The ability to interchange I/O and address pins allows this single bitstream to flow onto the FPGA from an off-chip memory device without intervention by the user. In fact, the RAM loader circuit design 150 can be added to the bitstream corresponding to the user's desired RAM data and circuit design without the user's knowledge, thereby allowing the manufacturer the opportunity to maintain a competitive advantage through the use of an improved loader circuit, the exact layout of which remains unknown to the user or competitor. Moreover, because configuration code can be automatically added to a user's configuration bitstream, simple software upgrades can allow the manufacturer to improve the utilized RAM loader circuit in a backward compatible fashion for all devices in the field or customized for all available devices without inconveniencing the user.

While the present invention has been described with reference to certain preferred embodiments, those skilled in the art to which the present invention pertains will now, as a result of the applicant's teachings herein, recognize that various modifications and other embodiments may be provided. By way of example, the precise loader design and configuration or data bit sequence may be modified while preserving the advantages of the coarse-grained block RAM loading and non-zero initialization ability of the present invention. Also, the preferred embodiment of the present invention is also compatible with partially configurable FPGAs. These and other variations upon and modifications to the embodiment described herein are deemed to be within the scope of the invention which is to be limited only by the following claims.

What is claimed is:

1. A method of loading data into a random access memory (RAM) block within a programmable logic device, said method comprising the steps of:

configuring the programmable logic device as a first circuit capable of loading the data into the RAM block;

loading the data into the RAM block; and configuring the programmable logic device as a second circuit which utilizes the data loaded into the RAM block.

2. The method of claim 1, wherein configuration information for said first circuit, the data, and configuration information for said second circuit are combined to form a single data stream which is input to the programmable logic device.

3. The method of claim 1, wherein the memory block is comprised of a plurality of memory elements.

4. The method of claim 1, wherein the programmable logic device is a field programmable gate array (FPGA).

5. The method of claim 1, wherein the programmable logic device is a partially reconfigurable field programmable gate array (FPGA).

6. The method of claim 1, wherein input lines to the programmable logic device function as input lines for loading said data through said first circuit.

7. The method of claim 1, wherein the method further comprises the steps of:

receiving said data in a resister means in the first circuit and forwarding said data to said RAM block;

writing said data to a predetermined position within said RAM block using an addressing means;

controlling said register means and said addressing means.

8. A computer-implemented system for loading data into a volatile memory block located within a programmable logic device, the system comprising:

means for forwarding a first configuration bitstream from a data storage unit to the programmable logic device to thereby initially configure the programmable logic device as a first circuit capable of loading the data into the volatile memory block;

means for supplying the data from the data storage unit to the programmable logic device configured as the first circuit for loading the data into the volatile memory block; and means for forwarding a second configuration bitstream from said data storage unit to the programmable logic device to thereby reconfigure the programmable logic device as a second circuit.

9. The computer-implemented system of claim 8, wherein said second circuit utilizes said data stored in the volatile memory block.

10. The computer-implemented system of claim 8, wherein said first and said second configuration bitstreams are combined with said data to form a consolidated bitstream.

11. The computer-implemented system of claim 8, wherein the volatile memory block is comprised of a plurality of dedicated memory elements.

12. The computer-implemented system of claim 8, wherein the programmable logic device is a field programmable gate array (FPGA).

13. The computer-implemented system of claim 8, wherein the programmable logic device is a partially reconfigurable field programmable gate array (FPGA).

14. The computer-implemented system of claim 8, wherein input lines to the programmable logic device function as input lines for loading said data through said first circuit.

15. The computer-implemented system of claim 8, wherein said first circuit comprises:

register means for receiving said data and forwarding said data to said memory;

addressing means for writing said data to a predetermined position within said memory; and control means for controlling said register means and said addressing means.

* * * * *